(12) United States Patent
Basu (10) Patent No.: US 7,593,447 B2
(45) Date of Patent: Sep. 22, 2009

(54) ROTARY DISK LASER MODULE

(76) Inventor: Santanu Basu, 6710 Abbottswood Dr., Rancho Palos Verdes, CA (US) 90275

( * ) Notice: Subject to any disclaimer, the term of this patent is extended or adjusted under 35 U.S.C. 154(b) by 374 days.

(21) Appl. No.: 11/180,078

(22) Filed: Jul. 12, 2005

(65) Prior Publication Data

US 2006/0007800 A1    Jan. 12, 2006

Related U.S. Application Data

(60) Provisional application No. 60/587,630, filed on Jul. 12, 2004.

(51) Int. Cl.
*H01S 3/06* (2006.01)
(52) U.S. Cl. .............. 372/67; 372/34; 372/35; 372/36; 359/333; 359/341.3; 250/493.1
(58) Field of Classification Search ............. 372/34–36, 372/66–68
See application file for complete search history.

(56) References Cited

U.S. PATENT DOCUMENTS

| | | | | |
|---|---|---|---|---|
| 3,487,322 A | * | 12/1969 | Ludlum | 330/289 |
| 4,833,682 A | | 5/1989 | Byer et al. | |
| 4,890,289 A | * | 12/1989 | Basu et al. | 372/33 |
| 4,894,836 A | * | 1/1990 | Hayakawa et al. | 372/45.01 |
| 5,164,947 A | * | 11/1992 | Lukas et al. | 372/22 |
| 5,265,115 A | * | 11/1993 | Amano | 372/75 |
| 5,289,485 A | * | 2/1994 | Mooradian | 372/45.01 |
| 5,790,291 A | * | 8/1998 | Britz | 398/129 |
| 5,893,662 A | * | 4/1999 | Ito | 399/110 |
| 6,339,605 B1 | * | 1/2002 | Vetrovec | 372/35 |
| 2002/0110164 A1 | * | 8/2002 | Vetrovec | 372/36 |

OTHER PUBLICATIONS

Transene Company Inc., Semiconductor and Thin Film Etchants for Microelectronic Circuits, www.transene.com/etchants.html, 3 pages (Not Dated).

* cited by examiner

*Primary Examiner*—Minsun Harvey
*Assistant Examiner*—Xnning Niu (57) ABSTRACT

A rotary disk module, having a rotary disk is interposed between a pair of heat sinks each spaced from the rotary disk by a gap. A motor is installed for driving the rotary disk to rotate. The gaps are filled with cooling medium such as helium, water or liquid nitrogen to remove the heat generated in the rotary disk by conduction, convection or evaporation. The rotary disk may be fabricated from various materials depending on the intended applications of the module, and the heat sink surfaces are preferably fabricated from materials with higher thermal conductivity. The rotation of the rotary disk allows the regions on which an optical pump radiation is delivered to be separated from the regions from which an optical radiation is extracted. In addition to improved heat dissipation effect, the rotation of the optical disk allows multiple directions of pump energy or multiple sources of pump energies and/or multiple beams of optical radiation to be applied and extracted simultaneously.

21 Claims, 10 Drawing Sheets

ROTARY DISK LASER MODULE

CROSS-REFERENCE TO RELATED APPLICATIONS

This application claims priority to Provisional Patent Application Ser. No. 60/587,630, filed Jul. 12, 2004, entitled ROTARY DISK LASER MODULE and Provisional Patent Application (Serial No. unknown) Filed Jun. 21, 2005, entitled OPTICAL ROTARY DISK MODULE, the teachings of which are expressly incorporated herein by reference.

STATEMENT RE: FEDERALLY SPONSORED RESEARCH/DEVELOPMENT

Not Applicable

BACKGROUND

The present invention relates in general to a method and an apparatus for removing heat generated in a rotary disk by transferring the heat to a heat sink in the proximity thereof.

The waste heat in any solid state laser medium often causes uncorrectable phase aberration in the path of the laser beam due to thermal and stress induced refractive index change. It imposes fundamental limitation on brightness of a conventional continuous-wave or quasi continuous-wave solid state laser in which the gain medium is stationary. Such problem is unavoidable and cannot be fully corrected by application of adaptive optics without causing significant power loss. The traditional design elements which control the performance of high-brightness solid state lasers include properties and shape of the gain medium, the optical pump source, and the mode of pumping and laser power extraction. Some other design considerations are phase locking of independent lasers, intermittent laser operation, and use of beam correction technologies. As mentioned above, the brightness of all these designs is limited by the uncorrectable phase aberration caused by increasing temperature.

BRIEF SUMMARY

A rotary disk module with an improved efficiency of heat dissipation or heat removal is provided. The rotary disk module can be adapted in various applications. For example, the rotary disk module may be used for providing optical gains in one or more laser amplifiers or laser oscillators. In nonlinear optics, the rotary disk module is operative to convert an incident pump beam into an optical radiation with different wavelength. The rotary disk can also be used to provide phase or intensity modulation of a high-power laser beam or generate an optical radiation from an electric energy.

The rotary disk module includes a rotatable disk operative to actively or passively generate heat. In the optical application, the rotary disk includes an optical disk for absorbing a portion of an incident pump energy and converting the absorbed incident pump energy into a desired optical radiation to be extracted in a laser oscillator or a laser amplifier. In other application, the heat may be generated by mechanical operation of the rotary disk or electric current applied to the rotary disk. The rotary disk is interposed between a pair of heat sinks each being spaced from the rotary disk by a gap. Both of the gaps may be fixed or adjustable; or alternatively, one of the gaps may be fixed while the other may be adjustable. A motor is installed for driving the optical disk to rotate. The gaps are filled with cooling medium such as helium, water or liquid nitrogen to remove heat from the optical disk by conduction, convection or latent heat of evaporation. The optical disk may be fabricated from various materials depending on the intended applications of the module, and the heat sink surfaces are preferably fabricated from materials with higher thermal conductivity.

In the basic configuration, a mechanical bearing is used to ensure stable motion of the optical disk. However the mechanical bearing may be replaced by a gas or fluid bearing. The rotation of the optical disk allows the regions in space where the incident pump energy is delivered to be separated from the regions in space where the optical radiation is extracted if such separation is needed. The rotation of the optical disk also allows separating the region in space where the heat is being deposited from the regions in space where the heat is being removed. In addition to the improved heat dissipation effect, the rotation of the optical disk allows multiple pump energies and/or multiple optical radiations to be applied and extracted simultaneously.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

As discussed above, a rotary disk module as provided can be applied in various devices for many different purposes such as providing gains for laser amplifiers and oscillators, wavelength conversion for nonlinear optics, providing phase modulation in a high-power laser beam, and generating an optical radiation from an electric energy. One of the optical applications is used as an example as follows for explaining and describing the detailed structures and functions of the rotary disk module. However, it will be appreciated that the application of the rotary disk module should not be limited to the optical application.

Figure 1:
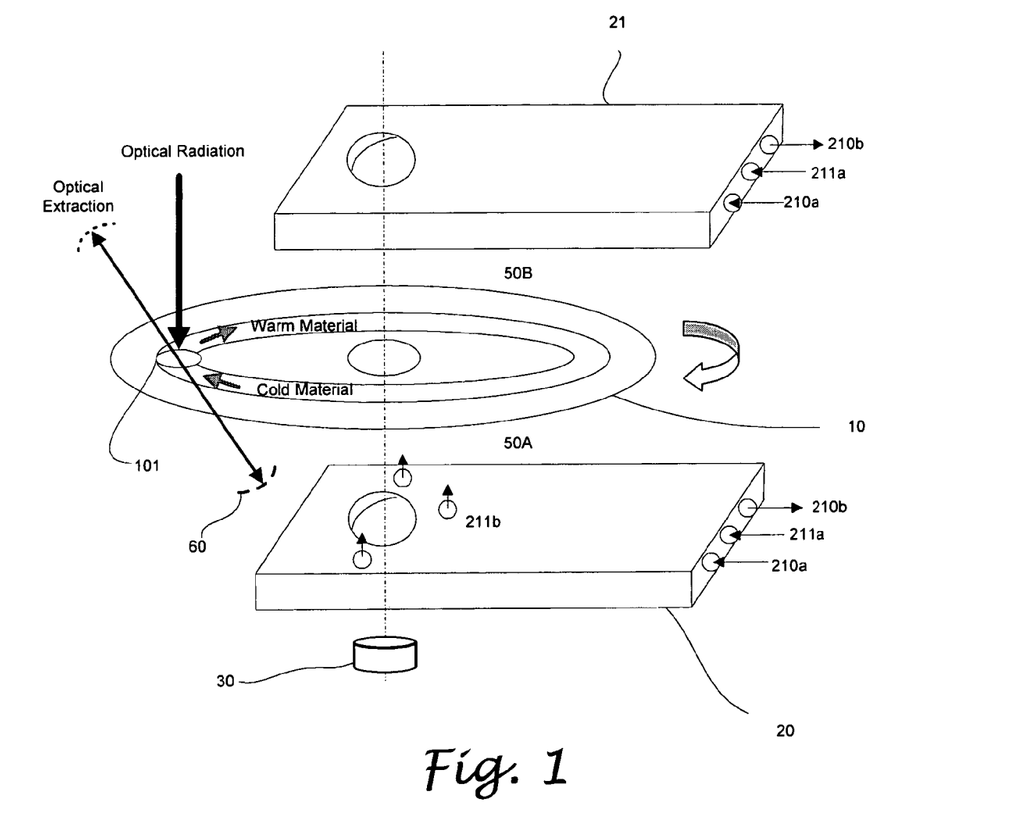
FIG. 1 illustrates an optical rotary disk module.
Figure 2:
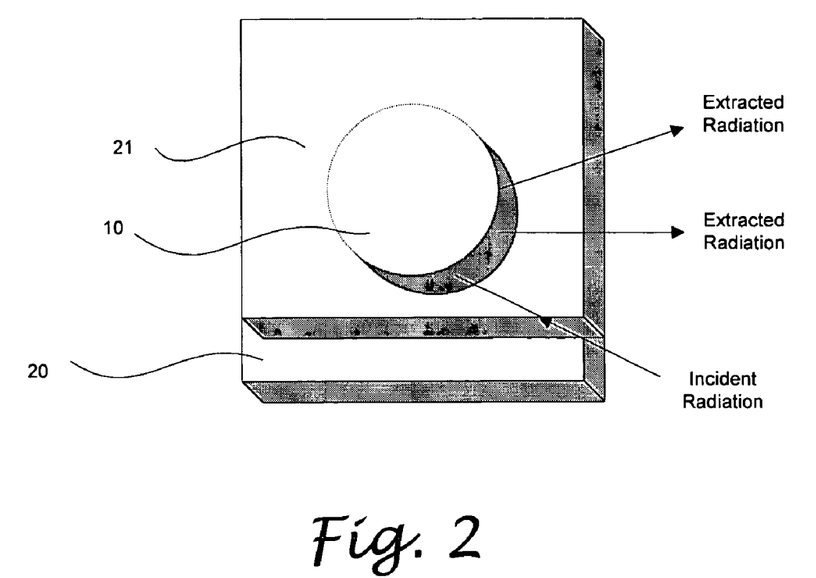
FIG. 2 shows an optical rotary disk module which delivers and extracts optical radiation to and from an optical disk thereof.

FIG. 1 illustrates an optical rotary disk module 1 that comprises a rotatable optical disk 10 inserted between a pair of heat sink 20 and 21. As shown, a part of the optical disk 10 is exposed from the heat sinks 20 and 21, such that the optical radiation can be incident thereon and extracted out therefrom. It will be appreciated that, in the current embodiment, the optical radiation is incident on the surfaces of the optical disk 10, such that at least a portion of the optical disk 10 has to be exposed instead of being completely covered by the heat sinks 20 and 21. In the case that the optical radiation is extracted from the edge of the disk and the input optical radiation is either generated in the disk or is incident from the edge of the disk as shown in FIG. 2, the optical disk may not need to be exposed. That is, the optical disk 10 may be totally covered by the heat sinks 20 and 21. In some applications, the heat sink is equipped with optical windows which allow optical radiation to pass but which also act to environmentally seal the space around the optical disk. This is particularly important when the cooling fluid is to be re-circulated.

Figure 4:
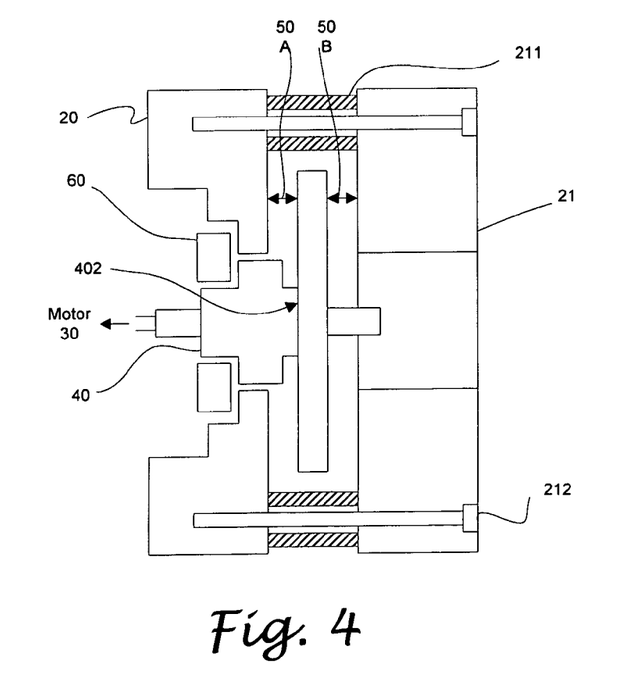
FIG. 4 shows the connection between the heat sinks and the optical disk as shown in FIG. 1.

As shown in FIG. 1, the center of the optical disk 10 is perforated with an aperture aligned with the apertures formed in the heat sinks 20 and 21. A motor 30 with a shaft structure (301 as shown in FIG. 4) extending through the apertures of the optical disk 20 and 21 can be used to drive the optical disk 10 to rotate about the center of thereof. In the embodiment as shown in FIG. 1, the apertures of the heat sinks 20 and 21 are formed near the periphery thereof to allow a portion of the optical disk 10 extending beyond the coverage of the heat sinks 20 and 21. Thereby, an optical radiation can be delivered to the extension of the optical disk 10. When the optical disk 10 remains stationary, delivery and extraction of optical radiation occur at the same position 101 of the optical disk 10. When the optical disk 10 rotates along the arrow as shown in FIG. 1, the position where the radiation is extracted may or may not be different from the position where the optical radiation is delivered to the optical disk 10. Between the optical disk 10 and the heat sinks 20 and 21, gaps 50A and 50B filled with gas or liquid for heat removal are formed. For the convenience of description, the faces of the heat sinks 20 and 21 proximate to the optical disk 10 are referred as the inner faces, and all other faces of the heat sinks 20 and 21 distal to the optical disk 10 are referred as the outer faces hereinafter.

Figure 3:
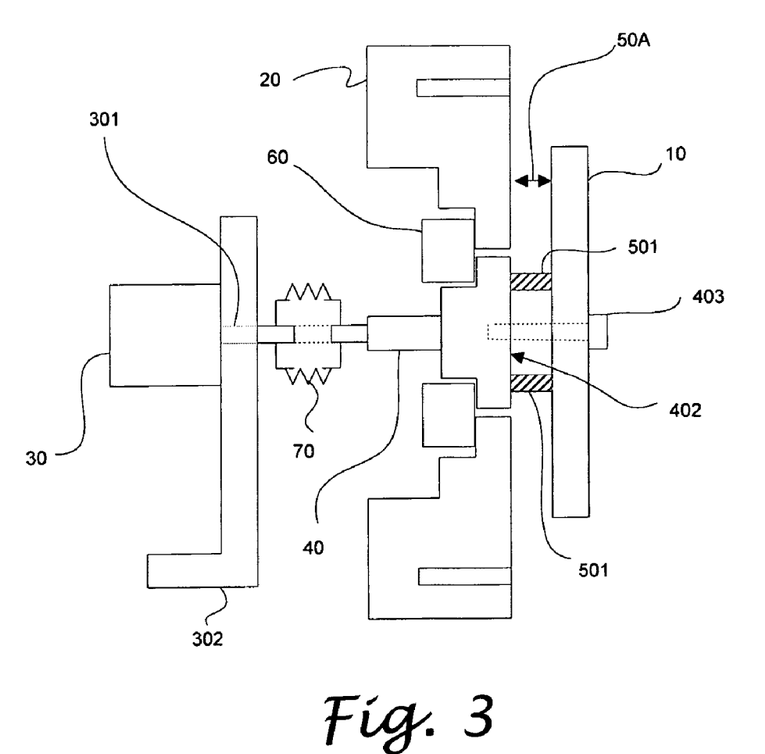
FIG. 3 is a partial cross-sectional view of FIG. 1 showing the connection between one of the heat sinks and the optical disk of the optical rotation disk module.
Figures 3A, 3B:
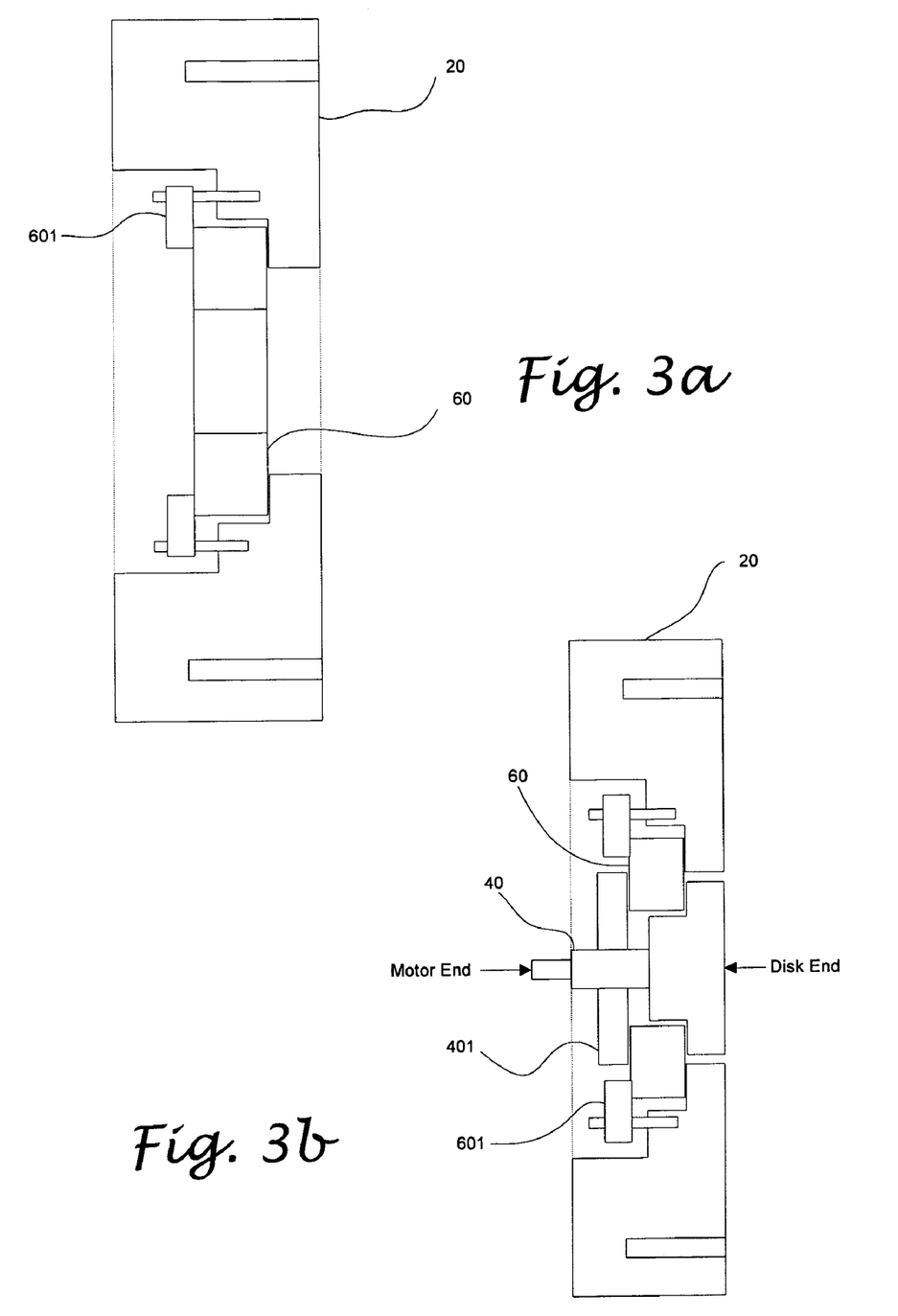
FIG. 3a is a cross sectional view showing the connection between the heat sink and a ball bearing as illustrated in FIG. 3.
FIG. 3b is a cross sectional view showing the connection between the heat sinks, the heat sink and a stepped cylinder as shown in FIG. 3.

The connection between the heat sinks 20, 21, the optical disk 10 and the motor 30 is illustrated in FIGS. 3, 3a, 3b and 4. As shown in FIG. 3a, a precision ball bearing 60 is mounted to the heat sink 20 by a bearing fastener 601, and a stepped cylinder 40 is attached to the ball bearing 60 using a nut 401 as shown in FIG. 3b. To fasten the stepped cylinder 40 within the nut 401, a part of the stepped cylinder 40 is preferably threaded to engage with the internal thread of the nut 401. Referring to FIGS. 3 and 3b, the stepped cylinder 40 has a motor end coupled to the shaft 301 of the motor 30 via a coupler 70, preferably a flexible coupler, and a disk end extending through the heat sink 20. The disk end of the stepped cylinder 40 terminates with a disk mounting surface for mounting the optical disk 10 thereon. It will be appreciated that the connection between the heat sink 20, the ball bearing 60, the stepped cylinder 40 and the optical disk 10 can also be facilitated by mechanisms other than the examples as provided above.

Figure 3C:
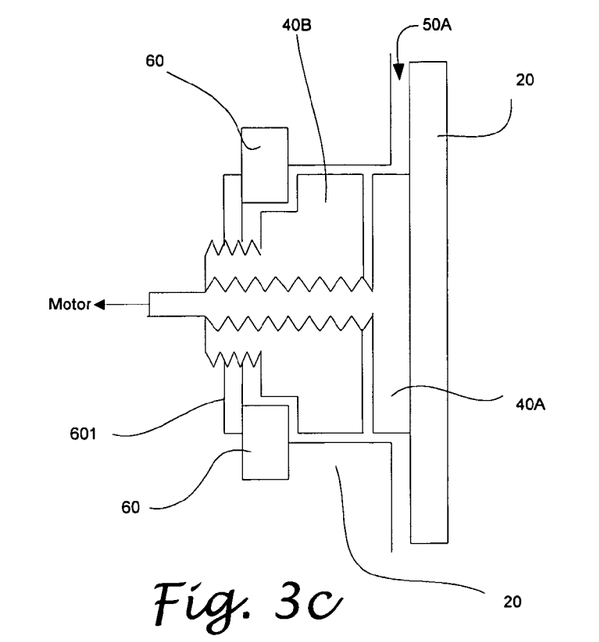
FIG. 3c shows a two-part stepped cylinder to provide adjust gap between the optical disk and one of the heat sinks.

To maintain the desired gap 50A between the heat sink 20 and the optical disk 10, in the embodiment as shown in FIG. 3, a spacer 501 is preferably installed to extend between the disk mounting surface 402 of the stepped cylinder 40 and the optical disk 10. The gap 50A defined by the spacer 501 can be as small as 12 micrometers. There is no upper limit on the thickness of the gap 50A. However, for practical applications, the thickness of the gap 50A can be considered between 12 micrometers and 10 mm. In addition to the spacer 501 as shown in FIG. 4, other structures may also be used to maintain the desired gap 50A between the heat sink 20 and the optical disk 10. For example, as shown in FIG. 4, after the disk mounting surface 402 of the stepped cylinder 40 is level with the inner surface of the heat sink 20, at least a portion of the disk mounting surface of the stepped cylinder 40 may be made to protrude out of the heat sink 20 to allow the optical disk 10 to be spaced from the heat sink 20 by the uniform gap 50A. The protruding disk mounting surface 402 may also be formed by polishing a portion of the inner face of heat sink 20 away the leveling step between the stepped cylinder 40 and the heat sink 20. An etching step may also be used to replace the polishing step for forming the protruding disk mounting surface 402. The protruding disk mounting surface may also be formed by making the stepped cylinder 40 in two parts, and by inserting a spacer between the two parts after the assembly step of leveling the disk mounting surface 402 with the heat sink 20. For an adjustable gap 50A, the stepped cylinder 40 may be made of two threaded parts 40A and 40B as shown in FIG. 3c, where one part 40A moves axially with respect to the other 40B. By fixing one part 40B of the stepped cylinder 40 to the heat sink 20 and the bearing 60, the other part 40A may be screwed in or out to adjust the gap 50A between the optical disk 10 and the heat sink 20.

When the heat sink 20 and the optical disk 10 are assembled by means of the ball bearing 60 and the stepped cylinder 40 as shown in FIG. 3, the heat sink 21 is attached to the assembly at the other side of the optical disk 10 as shown in FIG. 4. In the embodiment as shown in FIG. 4, the heat sink 21 is attached to the heat sink 20 via a number of (a pair is shown in the FIG. 4) of fasteners 212. To maintain the gap 50B between the heat sink 21 and the optical disk 10, a number of spacers 504 are installed to extend between the heat sinks 20 and 21. Similarly, there is no upper limit of the thickness of the gap 50B between the heat sink 21 and the optical disk 10. However, for practical applications, the gap 50B between the heat sink 21 and the optical disk 10 is set up between 12 micrometer and 10 mm. Preferably, the thickness of the spacers 504 is selected such that the gap 50B between the heat sink 21 and the optical disk 10 is equal to the sum of the thickness of the optical disk 10, the thickness of gap 50A and that of gap 50B. Preferably the spacers 211 are chosen such that the thickness of the gap 50B is uniform, and the optical disk 10 does not touch the heat sink 21 while in motion. The gap thicknesses 50A and 50B may be equal or different.

In addition to the uniform thickness of the gap 50B as described above, the gap 50B with adjustable thickness between the heat sink 21 and the optical disk 10 can also be made by various ways. For example, the spacer 211 as illustrated in FIG. 4 may be configured as a spacer screw that has a polished tip and threads, while one of the heat sinks 20 and 21 is equipped with threaded hole. By controlling the spacer screw, the thickness of the gap 50B between the heat sink 21 and the optical disk 10 can be adjusted. When the desired thickness is reached, the spacer screw is locked in place, and the heat sinks 20 and 21 are fastened to each other by the fasteners 212. When the gap 50B needs to be readjusted, the heat sinks 20 and 21 are unfastened by releasing the fasteners 212, and the spacer screw is operated to create the desired thickness of the gap 50B. In addition to the mechanical adjustment as described above, the spacers 201 can also be designed such that their height can be changed by thermal, electrical, pressure or other means.

As shown in FIG. 3, the motor 30 is mounted on a firm support 302, and the motor shaft 301 of the motor 30 is attached to the motor end of the stepped cylinder 40 via a flexible coupler 70. The flexible coupler 70 tolerates misalignment between the motor shaft 301 and the stepped cylinder 40. Examples of the flexible coupler 70 include bellows, plastic couplings, drive belts and other mechanisms that provide such misalignment tolerance.

The optical disk 10 may be made of any optical material. For example, for a laser application, the optical disk 10 may be made of a laser material such as Nd:YAG, Nd:YAG ceramic or Yb:YAG; for a nonlinear optical application, the optical disk 10 may be made of a nonlinear optical material such as beta barium borate or GaAs; for a semiconductor optical application, the optical disk 10 may be made of GaAs, Si, or Ge. The optical disk 10 may also contain fabricated structures of multiple materials. (The optical disk may be made of optical window material for optical window application; the optical disk may be made of holographic elements or microstructures for optical storage, beam steering, or control of intensity and phase). The lower end of the thickness of the optical disk 10 is limited by the desired flatness and other design consideration such as absorption of incident optical radiation, while the upper end of the thickness is limited by application requirements. For example, the thickness of the optical disk 10 may be between 0.1 mm and 20 mm for a rotary disk laser. The diameter of the optical disk 10 is limited by application, material availability, the desired flatness, the rotation speed, the dimensional tolerances, the torque requirement and the wobble, jitter and axial motion tolerances. In a rotary disk laser, the diameter of the optical disk 10 is in the range of 2 mm and 1000 mm, for example. The flatness of the optical disk 10, the parallelism between both surfaces of the optical disk, the bulk optical losses, and the coatings on both surfaces are dependent on specific application requirement. In addition, stepped cylinder 40 preferably includes a non-wedged step disposed between the bearing 60 and the disk mounting surface 402 to prevent the optical disk 10 from wobbling as it rotates.

The optical disk 10 may be of arbitrary shape, including but not limited to circular, elliptic and rectangular. The optical disk 10 may be made of material with physical or compositional patterns and combination of shapes. The optical disk 10 may also be in the form of a stack of multiple layers. In operation, the rotation of the optical disk 10 may be as simple as pure rotation. To the application of an optical rotary disk module, the motion may be arbitrary, including but not limited to rotation, translation, vibration, intermittent motion, and combinations of different motion patterns.

As mentioned above, the optical disk 10 is mounted on the disk mounting surface 402 of the stepped cylinder 40. Preferably, the disk mounting surface 402 is sufficiently flat, and the relative motion between the disk mounting surface of the stepped cylinder 40 and the inner face of the heat sink 20, including axial motion as well as wobble, should be zero. The zero relative motion can be realized by machining and polishing processes. More specifically, the inner face of the heat sink 20 is machined to be flat, and the dimensions of the stepped cylinder 40 are so selected that, while being assembled with the ball bearing 60, the disk mounting surface 402 of the stepped cylinder 40 is substantially parallel and level with the inner face of the heat sink 20. The flatness of the disk mounting surface of the stepped cylinder 40 and the inner face of the heat sink 20 are then improved by performing polishing thereon while the ball bearing 60, the stepped cylinder 40 and the heat sink 20 are assembled together.

To effectively remove heat generated in the optical disk 10, a gas or a liquid is introduced to fill the gaps 50A and 50B between the heat sinks 20, 21 and the optical disk 10. The heat can thus be transferred by means of conduction, evaporation or convection via the flow of the gas or liquid medium. When the gas medium such as air or helium is applied to fill the gaps 50A and 50B, the heat flow is determined primarily by conduction and secondarily by convection at low rotation speeds, for example, at 0-3000 rpm, of the optical disk 10. The heat flow per unit area is governed by the thermal conductivity of the gas medium, the thickness of the gaps 50A and 50B, and the local surface temperatures of the optical disk 10 and of the heat sinks 20 and 21. For convection, the temperature of the cooling fluid and the heat transfer coefficient which depends on the relative velocity between the optical disk 10 and the heat sinks 20 and 21 and the thermal properties of the fluid in the gap are important factors. For evaporation, the flow rate of the evaporative liquid over the disk, and the latent heat of evaporation are important. The heat flow can be improved by choosing a medium with high thermal conductivity such as helium, and by reducing the thickness of the gaps 50A and 50B. As shown in FIG. 1, gas/fluid enters and exits the heat sinks 20 and 21 through inlets/outlets 211a, and the gas/fluid outlets 211b are formed on the inner face of the heat sinks 20 and 21 to inject the gas/fluid medium to the gaps 50A and 50B. Cooling fluids such as helium, water or liquid nitrogen may be injected into the gaps 50A and 50B for removing the heat from the optical disk 10 by using various heat transfer mechanisms.

Figure 5:
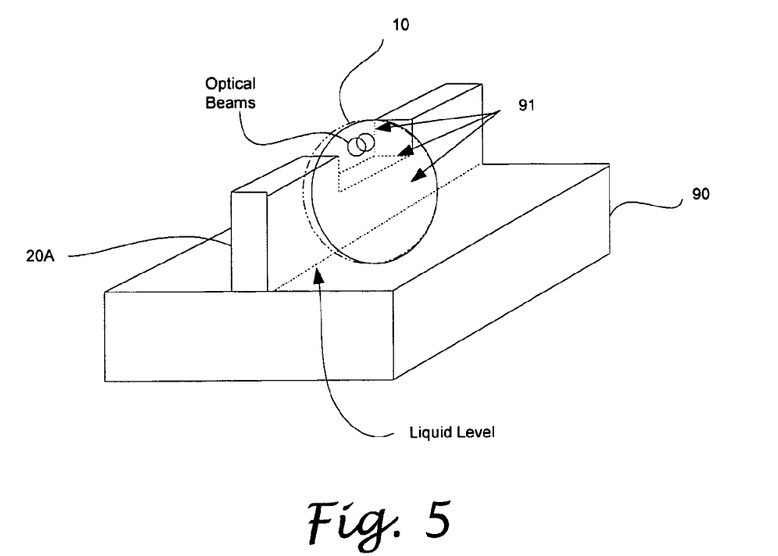
FIG. 5 shows an optical rotary disk module partially submerged in a liquid reservoir.
Figure 6:
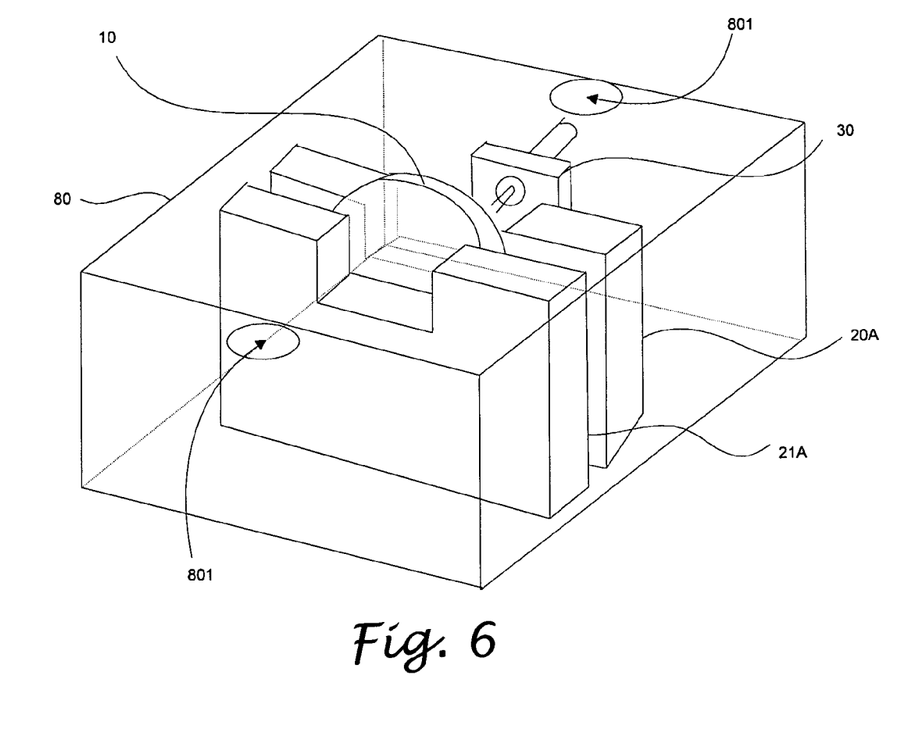
FIG. 6 shows an optical rotary disk module sealed within an enclosure which contains a cooling medium.

As mentioned above, a liquid medium may also be used in the gaps 50 to remove the heat by convection and conduction. Similar to the gas medium, the liquid medium may be supplied through the heat sinks 20 and 21. The liquid medium may also be supplied from a reservoir, and the optical disk 10 may move through a sealed liquid chamber or the liquid medium may be flowing over the surfaces of the optical disk 10. For example, as shown in FIG. 5, the optical disk 10 interposed between and supported by a heat sink assembly 200 is partially submerged within a reservoir 90 in which a cooling liquid such as water is contained. A source 91 is pointing at the portion of the optical disk 10 over the liquid level, so as to apply a jet of drying air (as indicated by the arrows) on the portion of the optical disk 10. Therefore, when the optical disk 10 is rotating in counterclockwise direction, the portion rotating from the liquid will be dried up by the liquid, such dried portion can then continuously rotate to the position allowing the optical beams to be incident thereon. Once the optical beams are applied, the temperature of this portion is raised and heat will be generated. The heat can then be removed by continuously rotating the heated portion into the liquid. Depending on the specific application, an O-ring type seal may also be used to separate wet and dry sections of the optical disk 10. Alternatively, the entire optical disk 10 may be submerged in a liquid, and the incident and extracted optical beams may propagate through the liquid surrounding the optical disk 10. FIG. 6 illustrates the rotary disk module 1 sealed within an enclosure 80 containing cooling medium such as helium therein. The enclosure 80 comprises a pair of windows 801 allowing optical radiation delivered to and extracted from the optical disk 10.

The heat sinks 20 and 21 may be made of a number of materials, including but not limited to metals such as aluminum, copper or steel, non-metal materials such as diamond, semiconductors such as silicon, or composites such as metal coated plastic. Typically, both the heat sinks 20 and 21 are used at two opposing surfaces of the optical disk 10. For certain applications that require only one surface of the optical disk 10 to be cooled, only one heat sink 21 is sufficient. The heat sinks 20 and 21 can be cooled in various ways. For example, as shown in FIG. 1, channels extending within the heat sinks 20 and 21 may be formed for circulating liquid such as cooling water. Each of the channels terminated with an inlet 210a for injecting cool water into the heat sink 20 or 21 and an outlet 210b from which the warm water is dispensed. The water may be replaced by compressed air for cooling the heat sinks 20 and 21.

Figure 7:
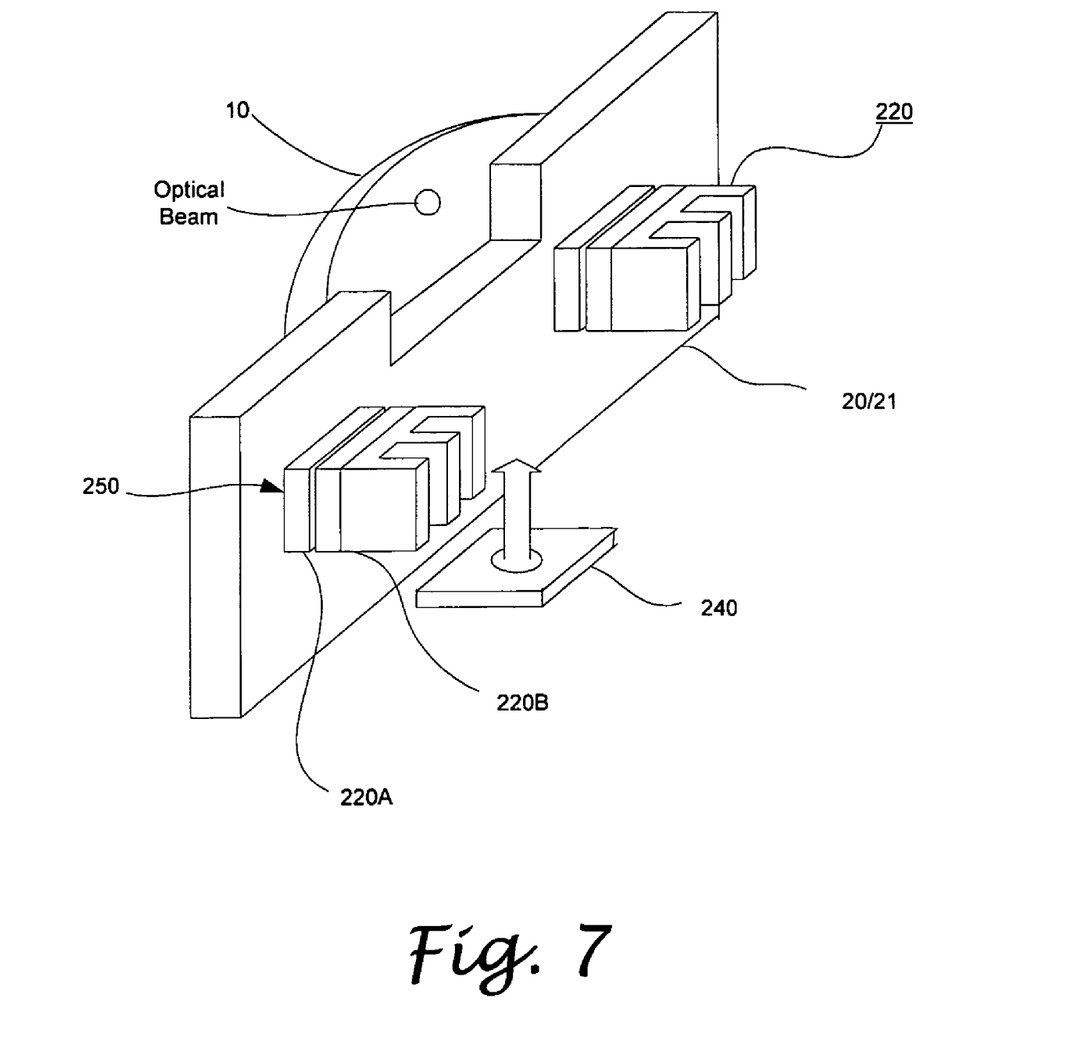
FIG. 7 shows an optical rotary disk module of which the rotary disk includes thermoelectric coolers.

In addition to the water or air circulation, thermoelectric cooler 220 can also be used for cooling the heat sinks 20 and 21 as shown in FIG. 7. In this case, the cold side of one or more thermoelectric cooler(s) 220A will be thermally contacted to the optical disk 10 and the hot side of the thermoelectric cooler(s) 220B will be coupled to a heat sink 20/21 which may be equipped with fins and fans 240 to remove the heat from the hot side 220B. The cold side 220A may be pressed against the heat sink 20/21 with thermally conductive grease 250 or indium for enhanced heat transfer from the heat sink 20/21 to the thermoelectric cooler 220. Fins or other structures may also be formed or attached to the heat sinks 20 and 21 such that the heat deposited in the heat sink can be transferred to the ambient by convection or radiation. The addition of fins is particularly effective to the optical disk 10 used in free space. The heat sinks 20 and 21 may also be cooled by heat pipes or direct contact with a solid which melts, and the latent heat of fusion is utilized to remove the heat from the heat sinks 20 and 21.

In operation, an optical radiation is delivered to the exposed portion 101 of the optical disk 10 as shown in FIG. 1. For the laser application, an optical pump radiation is focused on a small spot of the exposed portion 101 away from the center of the optical disk 10. The optical disk 10 absorbs a part of the incident optical pump radiation to create a laser gain, while unabsorbed radiation transmits through the optical disk 10. To increases the absorption, the unabsorbed radiation may be repeatedly collected and redirected to the surfaces of the optical disk 10 for multiple passes through the optical disk 10. In anther application, the optical disk 10 may be fabricated from nonlinear optical material, such that the optical radiation incident on the optical disk 10 will be converted into a radiation with different wavelengths.

When the optical radiation is delivered to the exposed portion 101 of the optical disk 10, in the laser application, the optically pumped region is placed in an optical resonator 60 as shown in FIG. 1, and the laser beam transmits through the optical disk 10 by being incident on the surfaces of the optical disk 10. In a particular geometry, the laser beam may transmit through the surfaces of the optical disk 10 along two different propagation directions, but each time being incident at Brewster angle, at which the reflection losses are minimized for a polarized laser beam. In the nonlinear optical application, the laser beam(s) which is(are) generated at new wavelengths are extracted from the optical disk 10 in almost the same direction of propagation of the incident optical radiation. When the optical rotary disk module 1 is used as a super-fluorescent light source, the optical disk 10 may be optically pumped on the surface or the edge thereof, and the light generated thereby may be extracted from the edge thereof. In this case, the heat sinks may not have apertures to let the optical beam pass through the faces of the disk.

Figure 8A:
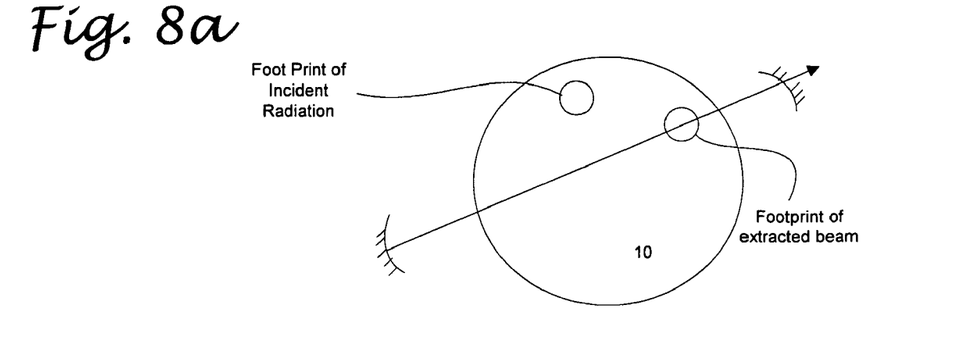
FIGS. 8a to 8c show various examples of delivery and extraction of optical radiation to and from the optical disk.
Figure 8B:
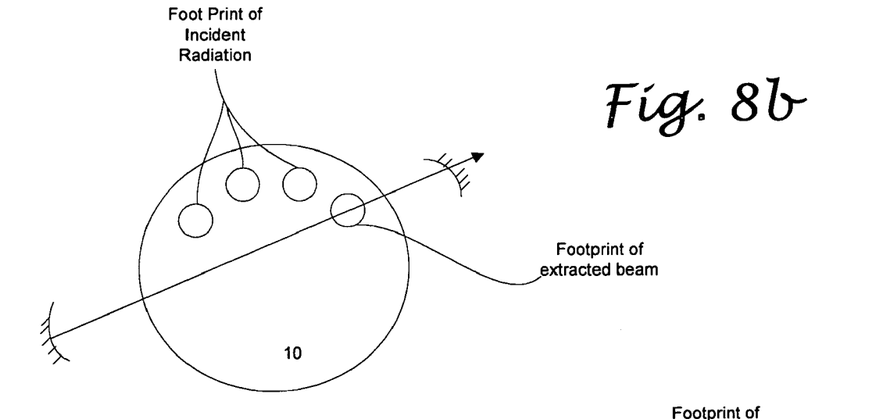
Figure 8C:
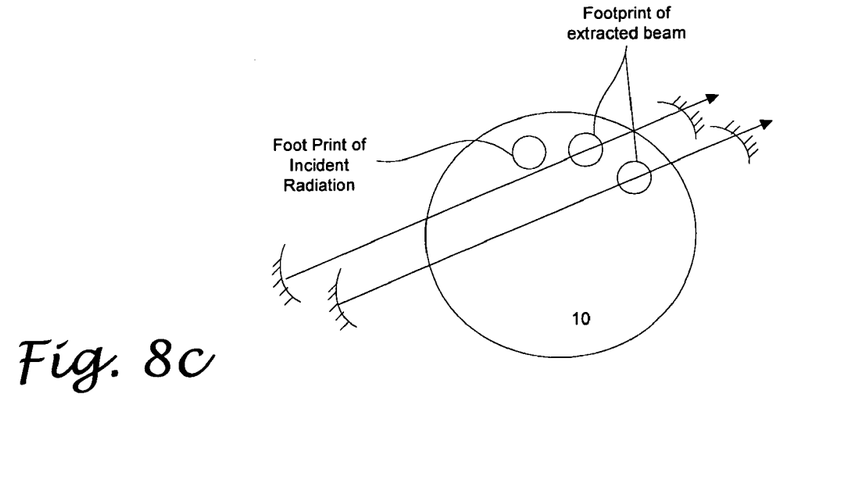

Referring to FIGS. 1 and 8a, by rotation of the optical disk 10, the region in which the optical radiation is delivered to the optical disk 10 may be same or different in the absolute coordinate frame from the region from which the optical radiation may be extracted. The rotation may be used to transport optically excited material in the disk to another location in the absolute coordinate frame. It is also possible to deliver optical radiation to several regions along different propagation directions in the optical disk 10 and to extract the optical radiation from only one region in the optical disk 10 as shown in FIG. 8b. When the optical radiation is delivered to only one region of the optical disk 10, the optical radiation can be extracted from multiple regions as shown in FIG. 8c. It is also possible to deliver optical radiation to multiple regions of the optical disk 10 and to extract the optical radiation from multiple regions of the optical disk 10. To separate the delivery region and extraction region of optical radiation, the rotation speed of the optical disk 10 is often adjusted based on the lifetime of the excitation of the optical medium of optical disk 10. The rotation speed is also adjusted to prevent overheating in the heated region of the disk, and to create a desired temperature profile in the region of the disk from which the optical radiation is extracted.

In the example of laser application, the optical disk 10 is optically pumped by several optical pump sources which are incident from different directions on different regions of the optical disk 10. The beam from each optical pump source may be passed through the disk several times to increase absorption of pump radiation in the disk The rotation of the optical disk 10 may be used to transport the optical pumped regions in a common resonator to extract the laser energy in only one beam. In another example, the optical disk 10 may be optically pumped at only one region, but the laser energy may be extracted in two or more different propagation directions simultaneously with more than one resonator applied at different regions of the optical disk 10. In yet another example of laser application, an optical disk 10, made out of Nd:YAG for example which can exhibit laser action at different wavelengths such as at 1318 nm and 1064 nm, the optical disk may be optically pumped at only one region, but the laser energy may be extracted out of two regions at two distinct laser wavelengths 1318 nm and 1064 nm. For a broadband laser medium such as Nd:glass, a number of lasers operating at separate wavelengths within the same broadband laser transition may constructed on the same optical rotary disk. In addition to the optical pumped radiation, when the optical disk 10 is made of a semiconductor material such as GaAs in which laser emitting structures such as quantum wells are fabricated, the semiconductor lasers in the optical disk 10 may be electrically activated, the laser beam may be extracted from the disk either through the surface or through the edges, and the heat generated in the optical disk is removed by heat transfer to the heat sinks. In one example of this configuration, a number of lasers may be formed with their resonators in the plane of the disk with the output beam emanating radially outwards; the laser structure is built up of GaAs/AlGaAs quantum wells in the thickness direction on the GaAs substrate, which is the optical disk; both flat surfaces of the disk are metallized; one surface is connected to ground, while the other surface is connected to a voltage source such that the laser action is sustained in the plane of the optical disk; the individual lasers may be isolated from each other using built in physical structures such as air gaps.

Figure 9A:
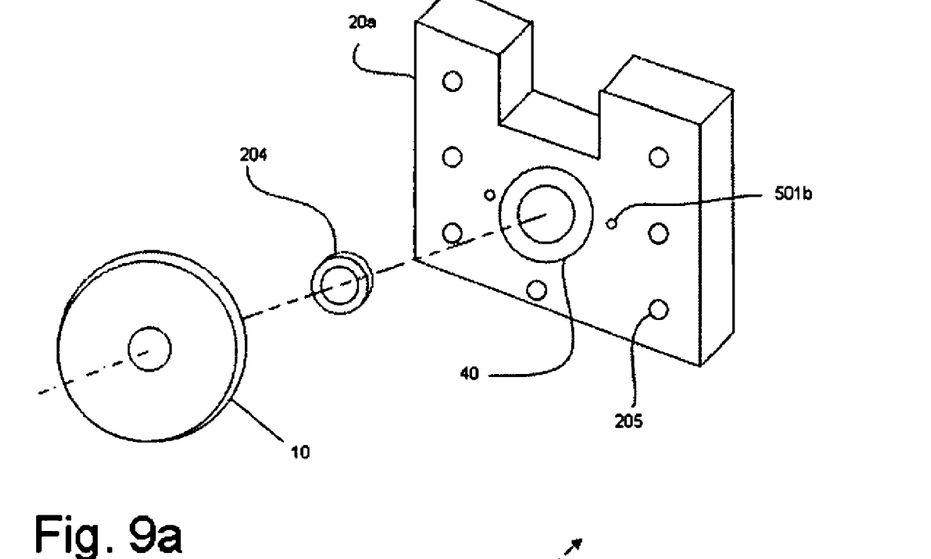
FIGS. 9a and 9b show a modification of the optical rotary disk module as shown in FIG. 1.
Figure 9B:
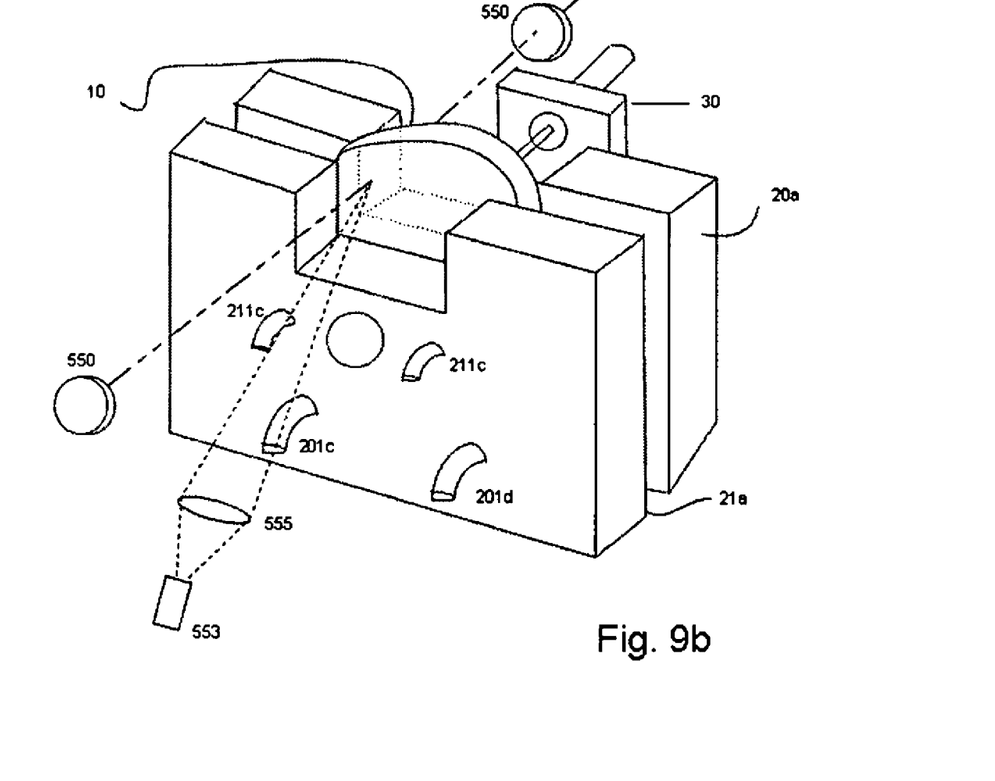

FIGS. 9a and 9b illustrate a modification of the optical rotary disk module as shown in FIG. 1. As discussed above, to allow the optical radiation delivered to the face of the optical disk 10, a portion of the optical disk 10 has to be exposed by the heat sinks 20a and 21a. As shown in FIGS. 9a and 9b, one side of each of the heat sinks 20a and 21a is recessed as a window, such that the optical disk 10 interposed between the heat sinks 20a and 21a can be partially exposed. The spacer 501 is installed between the optical disk 10 and the heat sink 20a to provide the gap 50A in between. A stepped cylinder 40 extending through the heat sink 20a is used to attach the optical disk 10 at a disk mounting surface 402 thereof and a motor 30 at a motor end thereof. When the motor 30, the heat sink 20a and the optical disk 10 are assembled, the heat sink 21a is attached to the heat sink 20a, such that the optical disk 10 is sandwiched between the heat sinks 20a and 21a. The attachment between the heat sinks 20a and 20b can be achieved by fasteners engaged with the fastening holes 205 formed in the inner faces of the heat sinks 20a and 21a, for example. The spacer 501 may also be applied between the optical disk 10 and the heat sink 21a to maintain uniform gaps 50A and 50B in between. The two-part stepped cylinder 40 and the screw spacer as shown in FIG. 3c and FIG. 4 may also be used for providing adjustable gaps 50A and 50 B. As shown in FIG. 9b, instead of forming the liquid inlet and outlet at the edge of the heat sinks, in this embodiment, the liquid inlets 201c and liquid outlet 201d can also be formed on the outer face of the heat sinks 20a and 21a. Moreover, the gas inlet 211c may also be formed in the outer face of the heat sinks 20a and 21a.

In the laser application, a pair of laser mirrors 550 is placed at two sides of the region of the optical disk 10 from which laser beam is to be extracted, while an optical pump radiation source 553 is used to emit an optical pump radiation towards the delivery region of the optical disk 10. As shown, an optical element such as a lens 555 is used for focusing the optical pumped radiation onto a small spot of the optical disk 10. Although the delivery region of optical pumped radiation and the extraction of the desired beam overlap each other as shown in FIG. 9b, it will be appreciated that by rotating the optical disk 10 with an adequate rotation speed according to the lifetime of excited atoms of the optical medium of the optical disk 10, the extraction region may be separated from the delivery region. In the embodiments as shown in FIGS. 1, 9a and 9b, rectangular heat sinks 20a and 21a are provided in the optical rotary disk module 1. It will be appreciated that the heat sinks 20a and 21a may be configured with other shapes to achieve the same effect as discussed above.

Figure 10A:
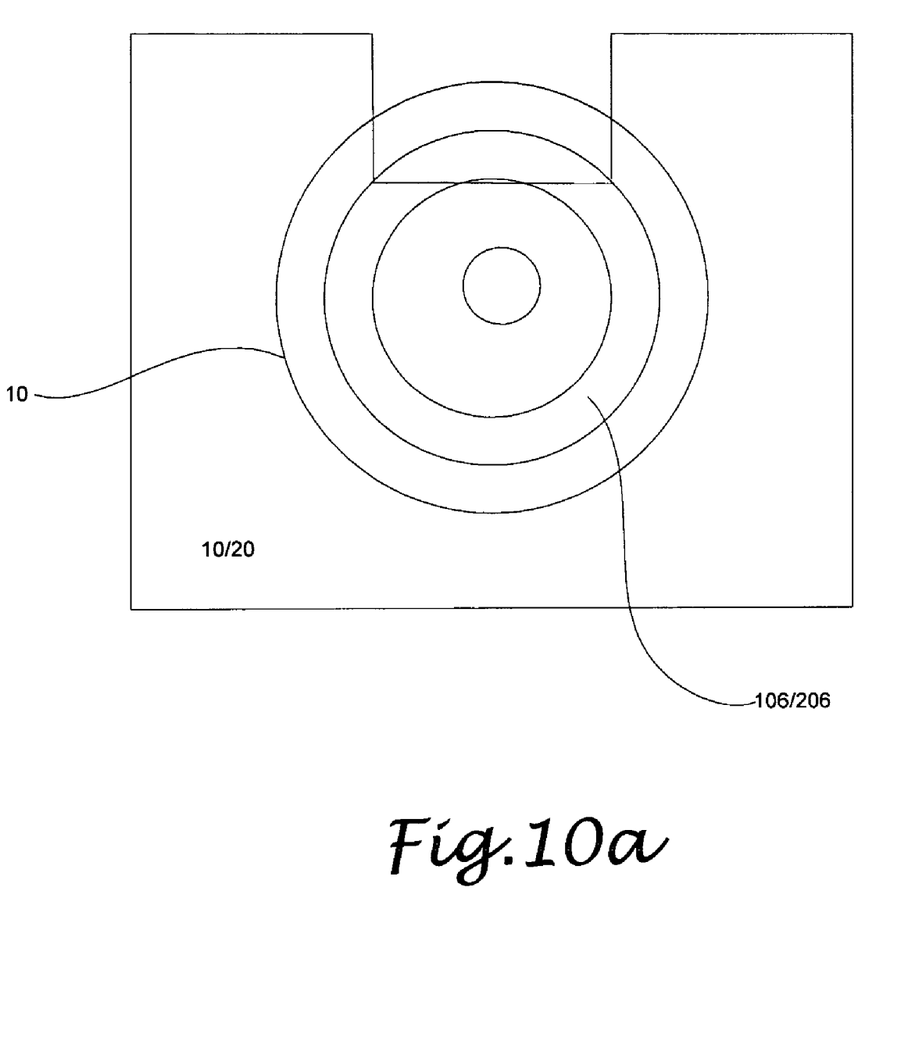
FIGS. 10a to 10c show a modified optical rotary disk module in which a raised annular profile is in the gap between the optical disk and the heat sink.
Figure 10B:
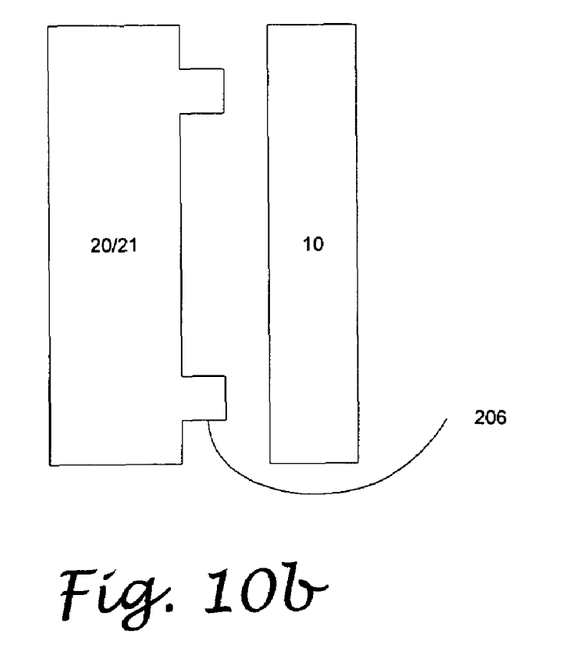
Figure 10C:
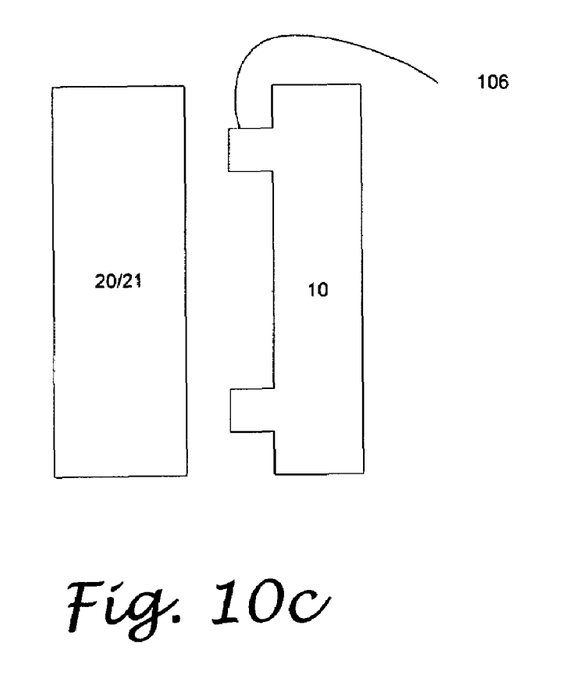

In the above embodiments, even if the gaps 50A and 50B between the heat sink 20 (20a) and the optical disk 10 are desired to be uniform, in actual implementation the gaps will vary across the optical disk surface due to residual fabrication errors in the heat sink and the in the optical disk, and residual assembly error in putting together the rotary disk module according to the procedure described here. In some cases however it is desirable to have a specific variation in the gap thickness across the disk surface. We give one example in the following. When the optical disk 10 is heated by the optical radiation at a fixed radial location away from the center, a temperature profile is set up in the radial direction. The temperature is maximum at the heated region and gradually decreases in the radial direction. In some applications, the temperature variation along the radial direction is undesired and needs to be minimized. For example, in a rotary disk laser, the radial temperature variation will cause focusing effect of the laser beam to be extracted. To avoid the radial temperature variation along the radial direction, the profile of the inner face of the heat sink and the surface of the optical disk may be modified as shown in FIGS. 10a-10c. FIG. 10a shows a top view of an optical rotary disk module of which the temperature profile along the radial direction is modified by formation of annular raised portion between the optical disk 10 and the heat sink 20. The annular raised portion 206 and 106 extend from either the heat sink 20/21 (20a/21a) towards the optical disk 10 as shown in FIG. 10b or from the optical disk 10 towards the heat sink 20/21 (20a/21a) as shown in FIG. 10c, respectively.

In a Nd:YAG laser application, the output of a laser diode radiation is focused on the surface of the disk to a spot with a diameter as small as 0.75 mm and at a distance of 25 mm away from the center of the optical disk; the heat sink can be machined to form an 0.075 mm wide annular raised section. When the top of the annular raised section is at a constant height of 1 mm, the gap between the heat sink and the optical disk is 1.075 mm at other radial locations. This forces the heat transfer to take place only at the annular heated section normal to the surface of the optical disk thereby minimizing the temperature profile in the radial direction. This in terms reduces focusing effect of the extracted laser beam. In some applications, more than one annular raised section can be formed on the heat sink or the optical disk.

Alternatively, the temperature profile along the radial direction can also be smeared out by moving the rotating optical disk 10 laterally between the heat sinks 20 and 21. When both rotation and translation are used, the effective heat transfer area increases, and optical disk remains cooler than the case when only rotation is used to distribute the heat. For example, if the rotating optical disk is placed on a translation stage that moves the disk back and forth over a distance greater than 0.75 mm within one period of revolution in a plane normal to the axis of rotation, and if the incident optical beam is focused to 0.75 mm spot on the surface of the disk, the temperature gradients in the radial direction as well as the temperature rise will be much smaller than the case when the translation stage is not used.

In many applications, the extracted beam does not transmit through the optical rotary disk module along a fixed direction, but is steered due to the wobble and jitter in the disk motion and due to thickness variation in the optical disk 10 which acts as a rotating wedge. The pointing error in the beam can be minimized in various ways. For example, the beam pointing error can be sensed using common optical means such as quadrant photodiodes or imaging cameras, and a set of actuated beam steering mirrors may be used to compensate for the measured beam pointing error, so as to direct the beam along a pre-specified direction. Alternatively, the optical disk 10 itself may be set on a two-axis actuated tilt or rotary stage, which can tilt the optical disk 10 based on the feedback from the beam pointing error sensors to keep the extracted beam along a constant direction. Thereby, the beam pointing error as measured can be compensated, and the beam can be redirected to the desired direction. In another embodiment, the beam may be designed to pass through the optical disk 10 several times at several locations, such that the net angular deviation can be averaged into an insignificant amount. For example, when the angular deviation is caused by a wedged disk, by passing the beam through the disk at two diametrically opposite locations, the angular deviation in each pass through the disk can be cancelled out.

Based on the embodiment as shown in FIG. 1, a Nd:YAG rotary disk laser can be established with the following parameters. The optical disk is in the form of a single circular disk fabricated form a laser material, Nd:YAG. The ionic concentration of Nd is about 1.1% by weight. The thickness of the optical disk is 3 mm, and the diameter of the optical disk is 60 mm. The surface waviness of the optical disk is less than 158 nm in peak height. The parallelism between the surfaces of the optical disk is in the range of 1 and 100 arc second. The beam pointing error in the extracted beam can be minimized by making the two flat surfaces of the disk as parallel as possible. The optical disk is coated with an antireflection coating at 808 nm for improved optical pump light absorption. The optical disk is rotated at a speed of 100 to 500 rpm about the central axis thereof. The rotation speed of the optical disk is optimized for maximum power output at any operating condition. At low rotation rate, the temperature rise in the optical pumped region reduces the extracted laser power and degrades the laser beam quality. At higher repetition rate, the excited atoms are transported out of the resonator before contributing to laser output, such that the extracted laser power is reduced. The gap thickness is chosen as 75 micrometers. In this example, six spacers of uniform thickness are positioned between the inner faces of the two heat sinks, while the thickness of the spacers is chosen as 3.15 mm to create the 0.075 mm gap on each side of the optical disk 10.

When adjustable gap thickness is required, six spacer screws with polished tips are used. In this example, each of the spacer screws has a diameter of 3/16" and 100 threads per inch. The medium filling the gaps is helium with a flow rate of 500 ml/min and an inlet pressure of 1-10 psi. The gaps are not sealed in this example, such that the helium may escape to ambient. The heat sinks are made of aluminum, and water manifold is fabricated within the heat sinks. The water temperature is maintained within a typical range of 5 to 30° C. The optical radiation is generated from a multimode fiber-coupled diode laser of 100 W average power and emission wavelength centered at 808 nm focused on a spot with a diameter 0.75 mm and a distance of 25 mm away from the center of the Nd:YAG optical disk. The diode laser radiation is incident normal to the optical disk. The transmitted diode laser radiation is collected and reimaged on the disk using a curved mirror at 808 nm. The optically pumped region of the optical disk is placed in a resonator, and the laser beam transmits through the optical disk by being incident on the surfaces of the optical disk at Brewster angle. Thus constructed, 30 W of laser radiation at 1064 nm wavelength can be extracted from the Nd:YAG optical disk. When the mirrors are removed, and an input laser beam at any of the lasing wavelengths of Nd:YAG (such as 1064 nm, 1318 nm and 946 nm) is incident on the Nd-YAG disk near the spot where the pump beam is incident, the optical rotary disk acts as a laser amplifier.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A rotary disk module, comprising:
a rotatable disk allowing heat and optical radiation to be generated or absorbed locally in at least one off-axis portion thereof;
wherein the rotatable disk is operative to absorb a pump energy incident on the portion and to convert the absorbed pump energy into a desired optical radiation;
an optical source for generating and delivering the pump energy to an edge of the optical device, such that a super-fluorescent optical radiation can be extracted from the edge of the rotatable disk;
at least a first stationary heat sink spaced from the rotatable disk by a first gap for removing the heat from the rotatable disk;
a bearing mounted to the first heat sink by a bearing fastener;
a stepped cylinder attached to the bearing; and
the rotatable disk mechanically connected to the stepped cylinder.

2. A rotary disk module, comprising:
a rotatable disk allowing heat and optical radiation to be generated or absorbed locally in at least one off-axis portion thereof;
at least a first stationary heat sink spaced from the rotatable disk by a first gap for removing the heat from the rotatable disk;
a bearing mounted to the first heat sink by a bearing fastener;
a stepped cylinder attached to the bearing;
the rotatable disk mechanically connected to the stepped cylinder; and
wherein the rotatable disk is operative to translate, vibrate, intermittently move, or perform combination motions thereof relative to the heat sink.

3. A rotary disk module, comprising:
a rotatable disk allowing heat and optical radiation to be generated or absorbed locally in at least one off-axis portion thereof;
at least a first stationary heat sink spaced from the rotatable disk by a first gap for removing the heat from the rotatable disk;
a bearing mounted to the first heat sink by a bearing fastener;
a stepped cylinder attached to the bearing;
the rotatable disk mechanically connected to the stepped cylinder; and
wherein the rotatable disk includes a profiled surface extending towards the first heat sink to control a temperature profile along a radial direction of the optical disk.

4. A rotary disk module, comprising:
a rotatable disk allowing heat and optical radiation to be generated or absorbed locally in at least one off-axis portion thereof;
at least a first stationary heat sink spaced from the rotatable disk by a first gap for removing the heat from the rotatable disk;
a bearing mounted to the first heat sink by a bearing fastener;
a stepped cylinder attached to the bearing;
the rotatable disk mechanically connected to the stepped cylinder; and
wherein the first heat sink includes a profiled surface extending towards the optical disk to control a temperature profile along a radial direction of the optical disk.

5. A rotary disk module, comprising:
a rotatable disk allowing heat and optical radiation to be generated or absorbed locally in at least one off-axis portion thereof;
at least a first stationary heat sink spaced from the rotatable disk by a first gap for removing the heat from the rotatable disk;
a bearing mounted to the first heat sink by a bearing fastener;
a stepped cylinder attached to the bearing;
the rotatable disk mechanically connected to the stepped cylinder; and
wherein a temperature profile in the optical disk is controlled by a device to translate the optical disk along the plane of the optical disk.

6. A rotary disk module, comprising:
a rotatable disk allowing heat and optical radiation to be generated or absorbed locally in at least one off-axis portion thereof;
at least a first stationary heat sink spaced from the rotatable disk by a first gap for removing the heat from the rotatable disk;
a bearing mounted to the first heat sink by a bearing fastener;
a stepped cylinder attached to the bearing;
the rotatable disk mechanically connected to the stepped cylinder;
wherein the rotatable disk is operative to absorb a pump energy incident on the portion and to convert the absorbed pump energy into a desired optical radiation; and
wherein the rotatable disk is between 0.1 mm to 20 mm thick when the extracted optical radiation includes a laser beam.

7. A rotary disk module, comprising:
a rotatable disk allowing heat and optical radiation to be generated or absorbed locally in at least one off-axis portion thereof;
at least a first stationary heat sink spaced from the rotatable disk by a first gap for removing the heat from the rotatable disk;
a bearing mounted to the first heat sink by a bearing fastener;
a stepped cylinder attached to the bearing;
the rotatable disk mechanically connected to the stepped cylinder; and
wherein a laser beam is passed through said rotatable disk in multiple locations, thereby minimizing any beam pointing error.

8. A rotary disk module, comprising:
a rotatable disk allowing heat and optical radiation to be generated or absorbed locally in at least one off-axis portion thereof;
a cooling medium surrounding at least a portion of the rotatable disk from which the heat is generated;
at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance;
wherein the heat sink is configured not to obstruct the absorption or generation of optical radiation; and
wherein the rotatable disk is only partially overlapped with the heat sink when the pump energy is incident on a face thereof.

9. A rotary disk module, comprising:
a rotatable disk allowing heat and optical radiation to be generated or absorbed locally in at least one off-axis portion thereof;
an optical source for generating and delivering the pump energy to an edge of the optical device, such that a super-fluorescent optical radiation can be extracted from the edge of the rotatable disk;
a cooling medium surrounding at least a portion of the rotatable disk from which the heat is generated;
at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance;
wherein the heat sink is configured not to obstruct the absorption or generation of optical radiation; and
wherein the rotatable disk is only partially overlapped with the heat sink when the pump energy is incident on a face thereof.

10. A rotary disk module, comprising:
a rotatable disk allowing heat and optical radiation to be generated or absorbed locally in at least one off-axis portion thereof;
a cooling medium surrounding at least a portion of the rotatable disk from which the heat is generated;
at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance and wherein the heat sink is configured not to obstruct the absorption or generation of optical radiation; and
wherein the rotatable disk is operative to translate, vibrate, intermittently move, or perform combination motions thereof relative to the heat sink.

11. A rotary disk module, comprising:
a rotatable disk allowing heat and optical radiation to be generated or absorbed locally in at least one off-axis portion thereof;
a cooling medium surrounding at least a portion of the rotatable disk from which the heat is generated;
at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance and wherein the heat sink is configured not to obstruct the absorption or generation of optical radiation; and
wherein the rotatable disk includes a profiled surface extending towards the first heat sink to control a temperature profile along a radial direction of the optical disk.

12. A rotary disk module, comprising:
a rotatable disk allowing heat and optical radiation to be generated or absorbed locally in at least one off-axis portion thereof;
a cooling medium surrounding at least a portion of the rotatable disk from which the heat is generated;
at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance and wherein the heat sink is configured not to obstruct the absorption or generation of optical radiation; and
wherein the first heat sink includes a profiled surface extending towards the optical disk to control a temperature profile along a radial direction of the optical disk.

13. A rotary disk module, comprising:
a rotatable disk allowing heat and optical radiation to be generated or absorbed locally in at least one off-axis portion thereof;
a cooling medium surrounding at least a portion of the rotatable disk from which the heat is generated;
at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance and wherein the heat sink is configured not to obstruct the absorption or generation of optical radiation; and wherein a temperature profile in the optical disk is controlled by a device to translate the optical disk along the plane of the optical disk.

14. A rotary disk module, comprising:

a rotatable disk allowing heat and optical radiation to be generated or absorbed locally in at least one off-axis portion thereof;

a cooling medium surrounding at least a portion of the rotatable disk from which the heat is generated;

at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance and wherein the heat sink is configured not to obstruct the absorption or generation of optical radiation; and wherein the rotatable disk is between 0.1 mm to 20 mm thick when the extracted optical radiation includes a laser beam.

15. A rotary disk module, comprising:

a rotatable disk allowing heat and optical radiation to be generated or absorbed locally in at least one off-axis portion thereof;

a cooling medium surrounding at least a portion of the rotatable disk from which the heat is generated; and at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance and wherein the heat sink is configured not to obstruct the absorption or generation of optical radiation; and wherein a laser beam is passed through said rotatable disk in multiple locations, thereby minimizing any beam pointing error.

16. A rotary disk module, comprising:

a rotatable disk allowing heat and optical radiation to be generated or absorbed locally in at least one off-axis portion thereof;

at least a first stationary heat sink spaced from the rotatable disk by a first gap for removing the heat from the rotatable disk, wherein the thickness of the gap between the rotatable disk and the stationary heat sink is adjustable to efficiently transfer the heat from the rotatable disk to the heat sink so as to enhance the optical performance and wherein the heat sink is configured not to obstruct the absorption or generation of optical radiation;

a second heat sink attached to the first heat sink at an opposing side of the rotatable disk; and a spacer extending between the first and second heat sink to provide a second gap between the rotatable disk and the second heat sink.

17. The rotary disk module of claim 16, wherein the second gap thickness is fixed or adjustable.

18. The rotary disk module of claim 16, wherein the second heat sink is attached to the first heat sink by a spacer screw having a polished tip and a plurality of threads.

19. The rotary disk module of claim 16, wherein the second heat sink is attached to the first heat sink by a spacer having a height adjustable by thermal, electrical or pressure adjusting means.

20. The rotary disk module of claim 16, wherein a second heat sink includes a profiled surface extending towards the optical disk to control a temperature profile along a radial direction of the optical disk.

21. A rotary disk module, comprising:

a rotatable disk allowing heat and optical radiation to be generated or absorbed locally in at least one off-axis portion thereof, wherein the rotatable disk is operative to absorb a pump energy incident on the portion and to convert the absorbed pump energy into a desired optical radiation;

at least a first stationary heat sink spaced from the rotatable disk by a first gap for removing the heat from the rotatable disk;

a sensor for measuring deviation between an actual propagation path and a predetermined propagation direction of the optical radiation extracted from the rotatable disk;

a correction device for reducing or canceling the deviation; and wherein the correction device includes a two-axis actuated tilt or a rotary stage for setting the rotatable disk.

* * * * *